United States Patent [19]

Sparling et al.

[11] Patent Number: 5,453,695
[45] Date of Patent: Sep. 26, 1995

[54] APPARATUS FOR RAPIDLY AND ACCURATELY TESTING ENCAPSULATED RELAYS AND SIMILAR DEVICES

[75] Inventors: Arthur J. Sparling, Bakersfield; Richard Andes, Redondo Beach; Nidal Kerdiya, Hawthorne, all of Calif.

[73] Assignee: Teledyne Industries, Inc., Los Angeles, Calif.

[21] Appl. No.: 40,529

[22] Filed: Mar. 31, 1993

[51] Int. Cl.$^6$ .................................................. G01R 31/02
[52] U.S. Cl. ..................... 324/418; 324/158.1; 324/755
[58] Field of Search .................................. 324/418–423, 324/158 P, 158 D, 158 R, 158 SC, 158 F, 755, 158.1

[56] References Cited

U.S. PATENT DOCUMENTS

| | | | |
|---|---|---|---|
| 3,579,102 | 5/1971 | Keating et al. | 324/418 |
| 4,311,961 | 1/1982 | Holt et al. | 324/418 |
| 4,947,111 | 8/1990 | Higman et al. | 324/755 |
| 4,950,980 | 8/1990 | Pfaff | 324/755 |
| 5,028,873 | 7/1991 | Koebke | 324/418 |
| 5,038,101 | 8/1991 | Murphy | 324/755 |
| 5,170,117 | 12/1992 | Chio | 324/755 |

*Primary Examiner*—Sandra L. O'Shea
*Assistant Examiner*—Warren S. Edmonds
*Attorney, Agent, or Firm*—Blakely Sokoloff Taylor & Zafman

[57] ABSTRACT

A relay test assembly including a majority of parts adapted to be injection molded and capable of withstanding large and rapid swings in temperature and humidity. These include a central approximately cylindrical body portion having a plurality of channels of generally-conical shape running therethrough generally-parallel to the axis of the body portion. The channels provide easy entry and straightening to leads of a relay Each channel includes a spring which may be brought to bear against a lead positioned in the channel to provide positive electrical contact to the lead while requiring no force to insert the lead. A sleeve positioned about the body portion is shaped to force the springs into contact with the relay leads.

9 Claims, 5 Drawing Sheets

5,453,695

APPARATUS FOR RAPIDLY AND ACCURATELY TESTING ENCAPSULATED RELAYS AND SIMILAR DEVICES

BACKGROUND OF THE INVENTION

1. Field Of The Invention

This invention relates to miniature electro-mechanical relays and semiconductor devices, and more particularly, to apparatus for rapidly and accurately testing such relays and devices in production.

2. History Of The Prior Art

Electro-mechanical relays have been used in electronic circuits for as long as such circuits have been manufactured. Such relays utilize a mechanical connector which is opened and closed to make contact between two points in a electric circuit. Although many such relays have been replaced by electronic switches which may be of microscopic size and thus may be placed within the tiny circuits of modern electronics, many situations exist where the electrical performance of an electro-mechanical relay is superior to that of the electronic switch. For example, an electro-mechanical relay can achieve a fiat amplitude response well into the gigahertz frequency range and still have a response down to direct current. The power handling capabilities of an electro-mechanical switch greatly exceed those of electronic switches. For these and many other reasons, electro-mechanical switches are useful in many situations.

A number of small electro-mechanical relays are encapsulated in very small housings and are used in various products such as aircraft which require significant testing over a wide range of temperature and environmental conditions. The testing of these parts is quite stringent because failure of the relays could have significant effect on the product with which they are used. For example, certain of these relays are tested across temperature ranges which vary from minus 65 degrees centigrade to plus 125 degrees centigrade. They are tested while being subjected to intense atmospheric moisture. The relays are subjected to these and a number of other tests for extended periods of up to two hours. Other encapsulated electrical devices such as semiconductor devices often must be similarly tested.

In order to test the relays, it is necessary to position each relay in some sort of a special test assembly or socket which allows the relays to be isolated in environments in which the test conditions may be applied. These assemblies or sockets must be placed in heating and refrigerating atmospheres and immersed in moisture for extended periods while various electrical tests are carried out. The extreme environmental conditions to which these sockets are subjected has made the sockets subject to drastic failure rates. For example, it has been typical for certain testing sockets to begin failing after as few as forty-three relays have been tested. Typically, such test sockets have been hand made by a process which requires approximately thirty hours of skilled labor to produce each socket. Since approximately 10,000 relays must be tested each day, the expense of testing and of constructing new sockets has made the relays overwhelmingly expensive.

SUMMARY OF THE INVENTION

It is, therefore, an object of the present invention to provide a new test assembly capable of construction using typical manufacturing techniques.

It is another object of the present invention to provide a test assembly which test assembly is subject to long use under extreme environmental conditions without failure.

These and other objects of the present invention are realized in a relay test assembly constructed of a majority of parts adapted to be injection molded and capable of withstanding large and rapid swings in temperature and humidity. These comprise a central approximately cylindrical body portion having a plurality of channels of generally-conical shape running therethrough generally-parallel to the axis of the body portion. The channels provide easy entry to and straightening of the leads of a relay. Each channel includes a spring contact which may be brought to bear against a lead positioned in the channel to provide positive electrical contact to the lead while requiring no force to insert the lead. A sleeve positioned about the body portion is shaped to force the springs into contact with the relay leads.

DETAILED DESCRIPTION OF THE INVENTION

Figure 1:
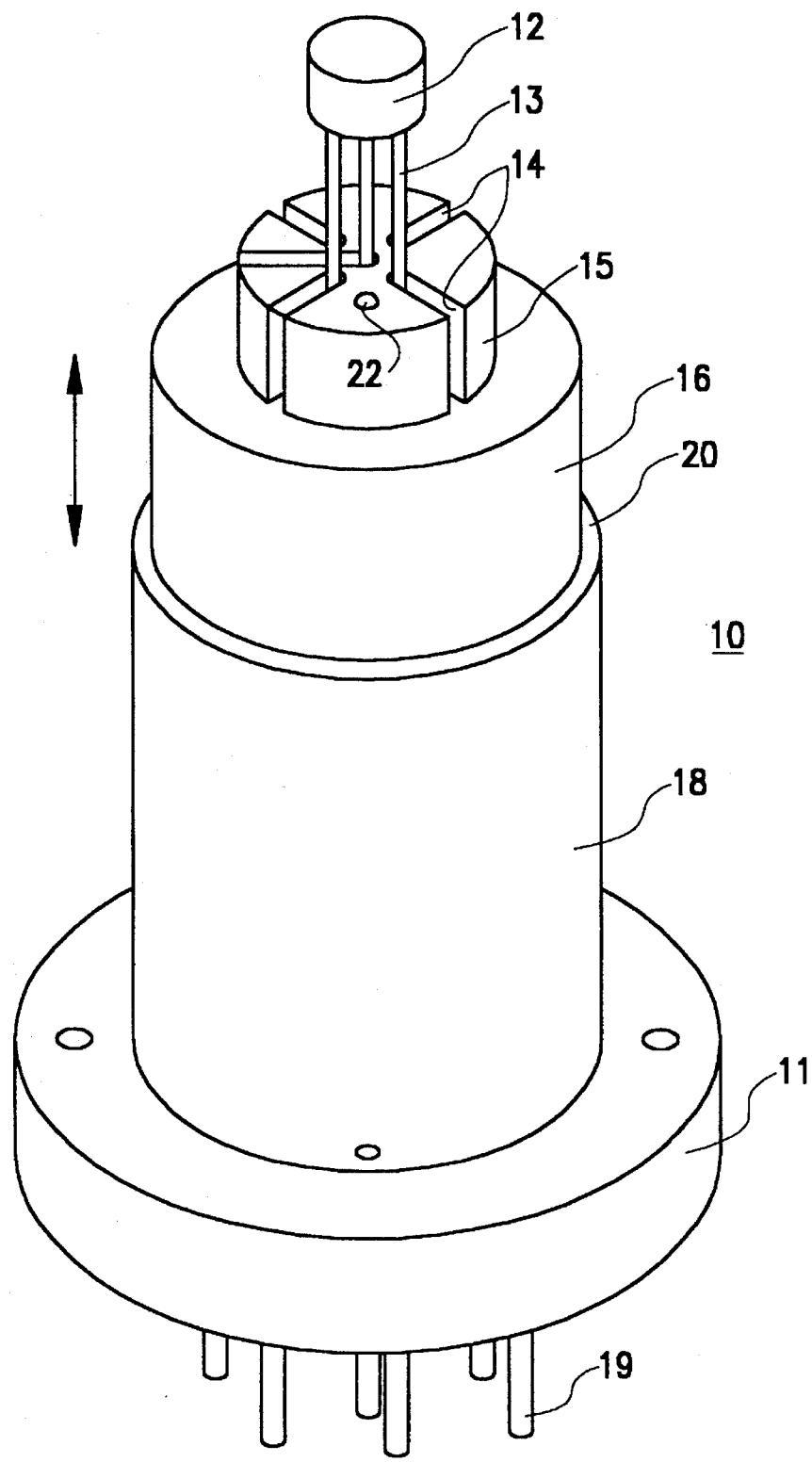
FIG. 1 is a perspective view of a test assembly designed in accordance with the present invention.

Referring now to FIG. 1, there is illustrated a perspective view of a test assembly 10 designed in accordance with the present invention. The test assembly 10 is illustrated with an electro-mechanical relay 12 of one type which may be tested using the assembly 10 positioned above the assembly 10. The relay 12 has a plurality (five in the embodiment illustrated) of conductors or leads 13 which provide signals to the relay 12. These leads 13 are illustrated positioned to be inserted into a plurality of channels 14 in a cylindrically-shaped inner body portion 15 of the assembly 10. Within the channels 14 are positioned spring connectors (not shown in FIG. 1) which are adapted to make electrical connection to the leads 13 placed in the channels 14 so that the leads 13 may make electrical connection to individual ones of a plurality of conductors 19 leading from the base of the assembly 10. The conductors 19 may be connected to various sources of voltage and current by which the tests on the relays 12 are conducted. A hollow generally-cylindrical sleeve 16 fits around the exterior of the inner body portion 15 and slides up and down between the top surface of the portion 15 and an outer protruding edge 20 of a cylindrical lower portion 18 of the assembly 10. A base 11 joins the lower portion 18 so that the assembly 10 may be mounted to allow its testing. Typically, a number of assemblies 10 are mounted to a fiat plate (not shown) which forms a door to an interior space within which a desired environment may be produced.

The sleeve 16 is hollow and generally-cylindrical in shape. In its upward position, the sleeve 16 exerts no force on the spring conductors within the channels 14 so that the leads 13 may be easily inserted within the channels 14 without requiring any insertion force which might scratch the spring conductors or scratch or bend the leads 13 thereby providing different contact surfaces and causing differing readings when electrical signals are applied. When the lower base of the relay 12 is forced against the upper surface of the inner body portion 15, the lower surface of the relay 12 forces a spring-mounted contact 22 positioned in a vertical channel within the inner body portion 15 downward into the vertical channel. The contact 22 provides an electrical path which connects to another conductor 19 projecting from the base of the assembly 10 by which an electrical measurement at the base of the relay 12 may be made during testing.

Figure 2:
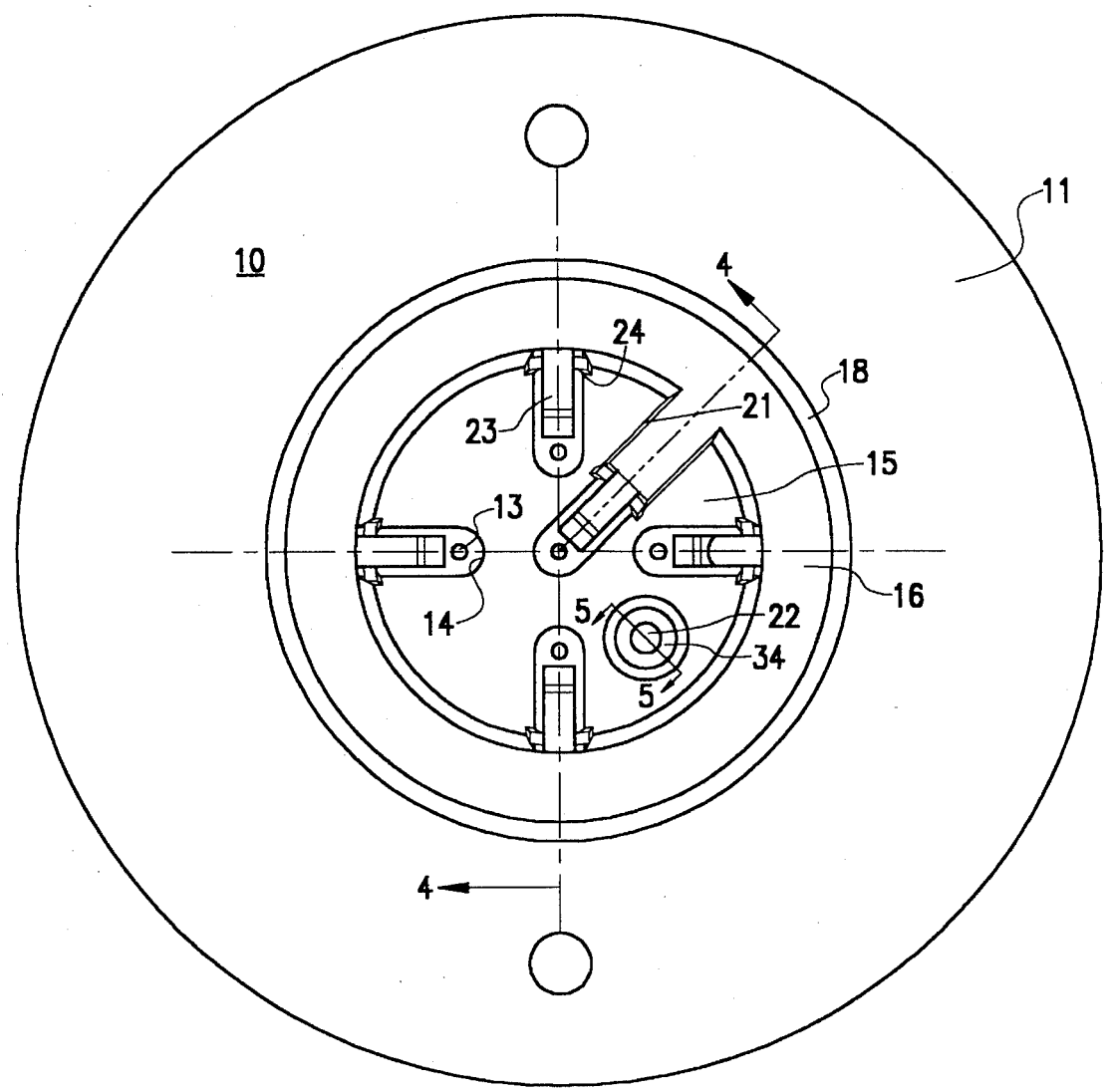
FIG. 2 is a top view of the test assembly illustrated in FIG. 1.
Figure 3:
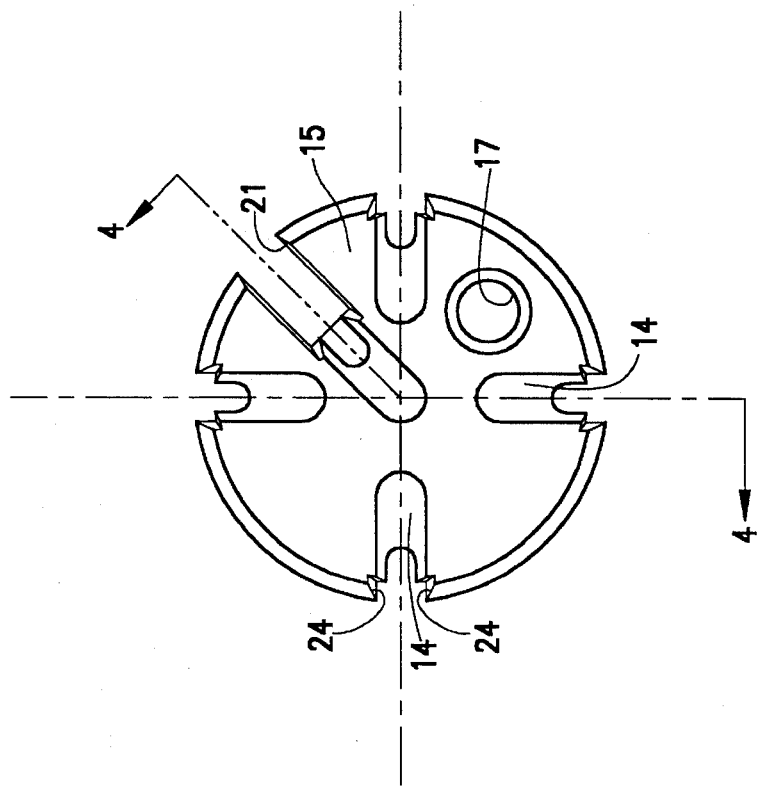
FIG. 3 is an enlarged top view of the test assembly illustrated in FIG. 1.
Figure 4:
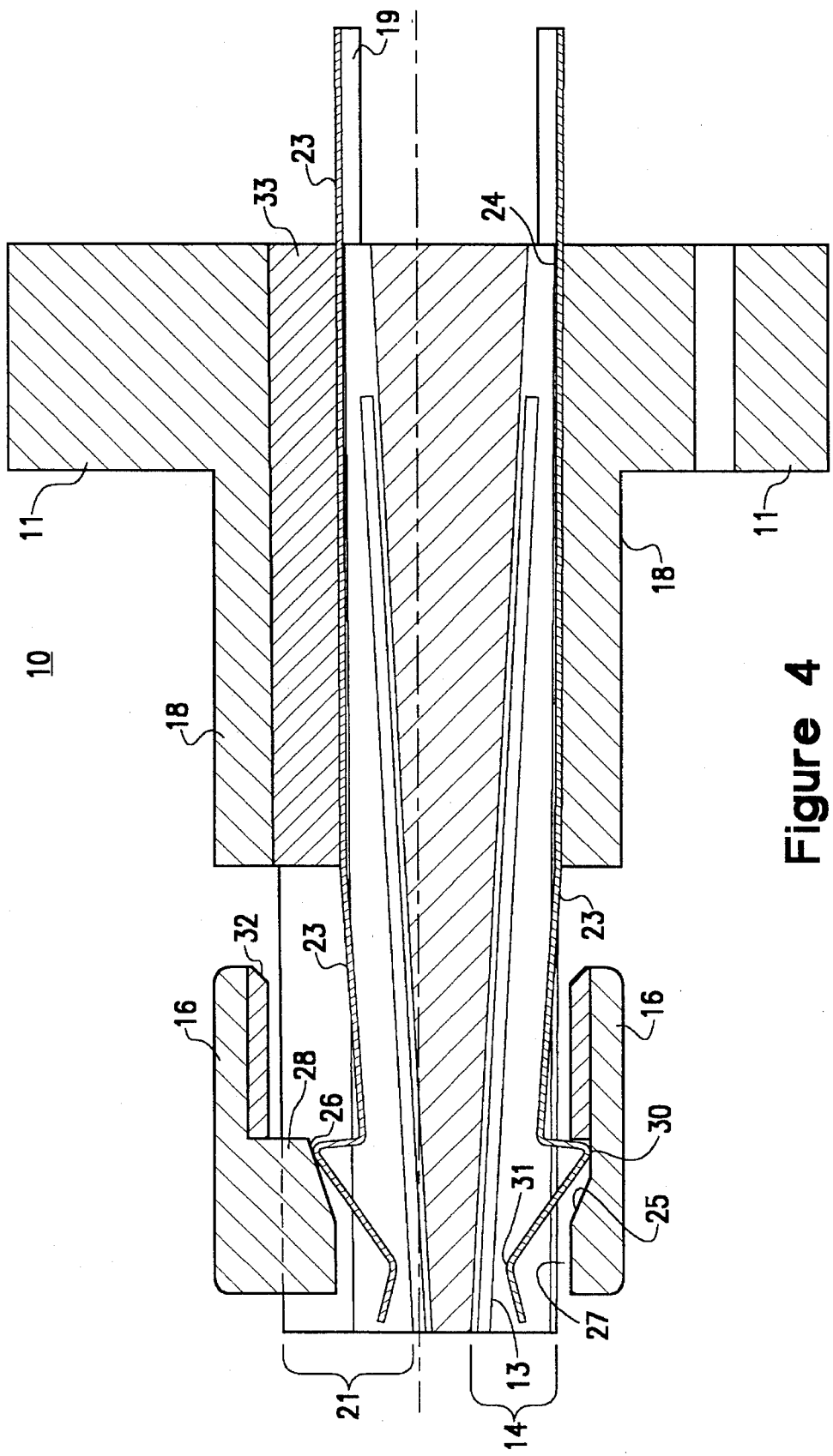
FIG. 4 is a side cross-sectional view of the test assembly illustrated in FIG. 1.

FIG. 2 is a top view of the assembly 10 illustrating the assembly 10 with its various parts assembled. FIG. 3 is another top view of the body portion 15 of the assembly 10 without certain of the internal parts in place and enlarged to aid in understanding the shape of the assembly 10. As is illustrated in FIG. 3, each of the channels 14 is formed with flat generally-parallel sides which taper slightly toward one another at the lower end and are connected by a surface generally formed as a half cone. The tapered sides and the half cone shape provide a convenient form by which the conductors 13 joined to the relay 12 may be guided into the channels. The polyester material of which the body portion 15 is manufactured aid in the ease of insertion of the leads. The position of the conductors 13 in each of the channels 14 is shown in the views of FIG. 2 and 4. As may be seen clearly in the cross-sectional view of FIG. 4, each of the channels 14 has a relatively large opening at its upper end which decreases in dimension toward the base of the assembly 10. This provides an easy path for the insertion of the leads 13 and a lead straightening effect when leads 13 are inserted completely into the channels 14. It should be noted that prior art assemblies utilized rolled metallic connectors within channels which encircled and 15 exerted a constant spring force on a lead of a relay placed in the channel. It was necessary for any lead to force the metallic spring connector outward as it was placed in the channel thereby scratching the connectors and the leads and distorting the shape of the leads. This distortion in shape made the leads much harder to insert and lengthened the testing time appreciably.

As may be seen in FIG. 3, each of the channels 14 widens at the outer circumference of the body portion 15 toward the lower end of the assembly 10 to provide a fiat wide groove 24. As may be seen in FIG. 4, each of the conductors 19 projecting from the base of the assembly 10 is connected to a conductor 23 which is positioned within the wide fiat groove 24 of the channel 14. Alternatively, each of the conductors 19 may be formed in a single piece with one of the conductors 23. Each conductor 23 is generally-flat, long, and thin and is manufactured of a spring material (such a beryllium copper alloy well known to those skilled in the art and adapted to exert a constant spring force over a wide range of temperatures without being subject to corrosion). The upper portion of each conductor 23 is shaped to allow it to be pressed into contact with a lead 13 inserted into the wide groove 24 of the channel 14. The lower portion of the conductors 23 is wider than the upper portion of the conductor 23. This lower portion of the conductor 23 allows it to be fixed in the wide outer channel of the channel 14 in the portion 15. The lower portion 18 is a hollow cylinder which fits over the lower part of the portion 15 and holds the wide portion of the conductors 23 tightly fixed in the wide outer groove 24 of the channel 14.

The sleeve 16 has a conical inner surface 25 adapted to press the upper portion of each of the spring conductors 23 into a single point contact with a lead 13 of the relay 12 when the sleeve 16 is in its lowered position as seen in FIG. 1. As mentioned, each of the conductors 23 is generally-fiat as may be seen in the top view of FIG. 2 and extends generally straight from the wider lower end (held in place by the lower portion 18) almost to the top of the assembly 10 as may be seen in the cross-section of FIG. 4. Each conductor 23 narrows at the upper end so that the upper end fits within the narrower portion of the channel 14. At the upper end, the conductor 23 is first bent toward the outer surface of the body portion 15, then back toward the center of the body portion 15 and then finally bent slightly back toward the outer surface of the body portion 15. The inner conically-shaped surface 25 of the sleeve 16 bears against the outwardly-projecting portion 30 of each of the conductors 23 and forces inwardly-projecting points 31 of the conductors 23 into contact with the leads 13 of a relay 12 in position in the assembly when the sleeve 16 is slid downward over the outside of the portion 15 to the position seen in FIG. 1. A cylindrical inner surface 27 of the sleeve 16 maintains the conductors 23 in contact with the leads 13 as long as the sleeve 16 remains in a lowered position. In this position, the relay may be tested by furnishing various levels of voltage and current to the leads 13 for specified periods. When the sleeve 16 is raised, the sloping inner surface 25 allows the conductors 23 to move back into the normal relaxed position defined by its spring material so that the leads 13 of the relay 12 are released. A stop for the outwardly-projecting portion 30 of each of the conductors 23 is provided by a cylindrical insert 32 which fits within the interior of and moves with the sleeve 16.

Figure 6:
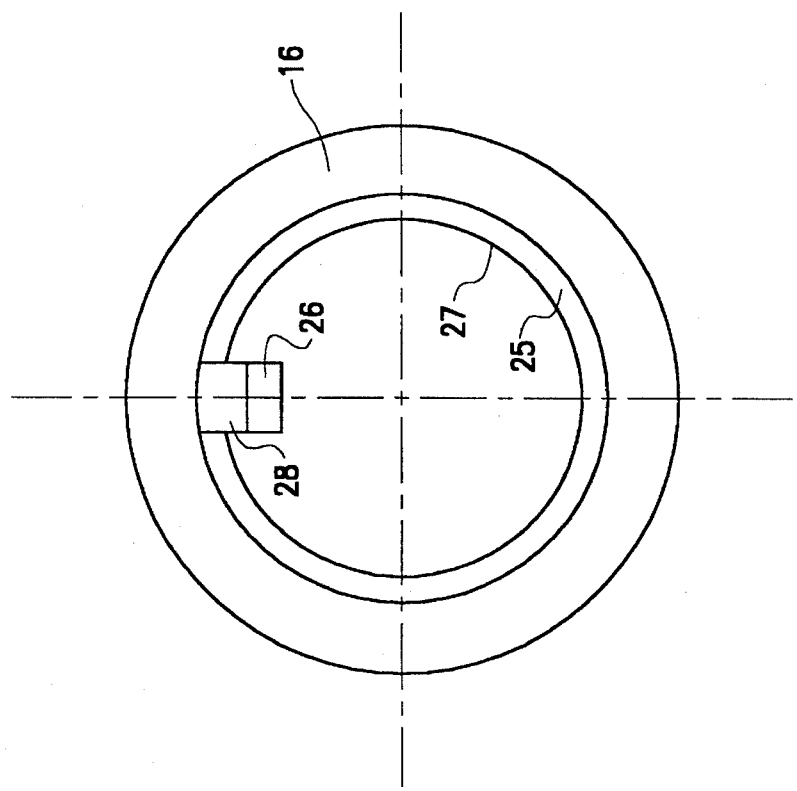
FIG. 6 is a bottom view of a detail of the assembly illustrated in FIG. 1.

It will be noted that a single additional channel 21 which is essentially identical in shape to the channels 14 is positioned to allow a lead 13 projecting from the lower center of the base of the relay 12 to contact a conductor 23. This channel 21 receives a fiat finger 28 (see FIGS. 4 and 6) which is a part of the sleeve 16 and projects inwardly to ride within the parallel sides of a wider outer channel portion of the channel 21. Like the conical portion 25 of the sleeve 16, the finger 28 has a sloping surface 26 designed to force the conductor 23 in that central channel 21 into contact with a lead 13 extending from the center of the base of the relay 12. The lower portion of the conductor 23 is held in place within the base 15 by an insert 33.

Figure 5:
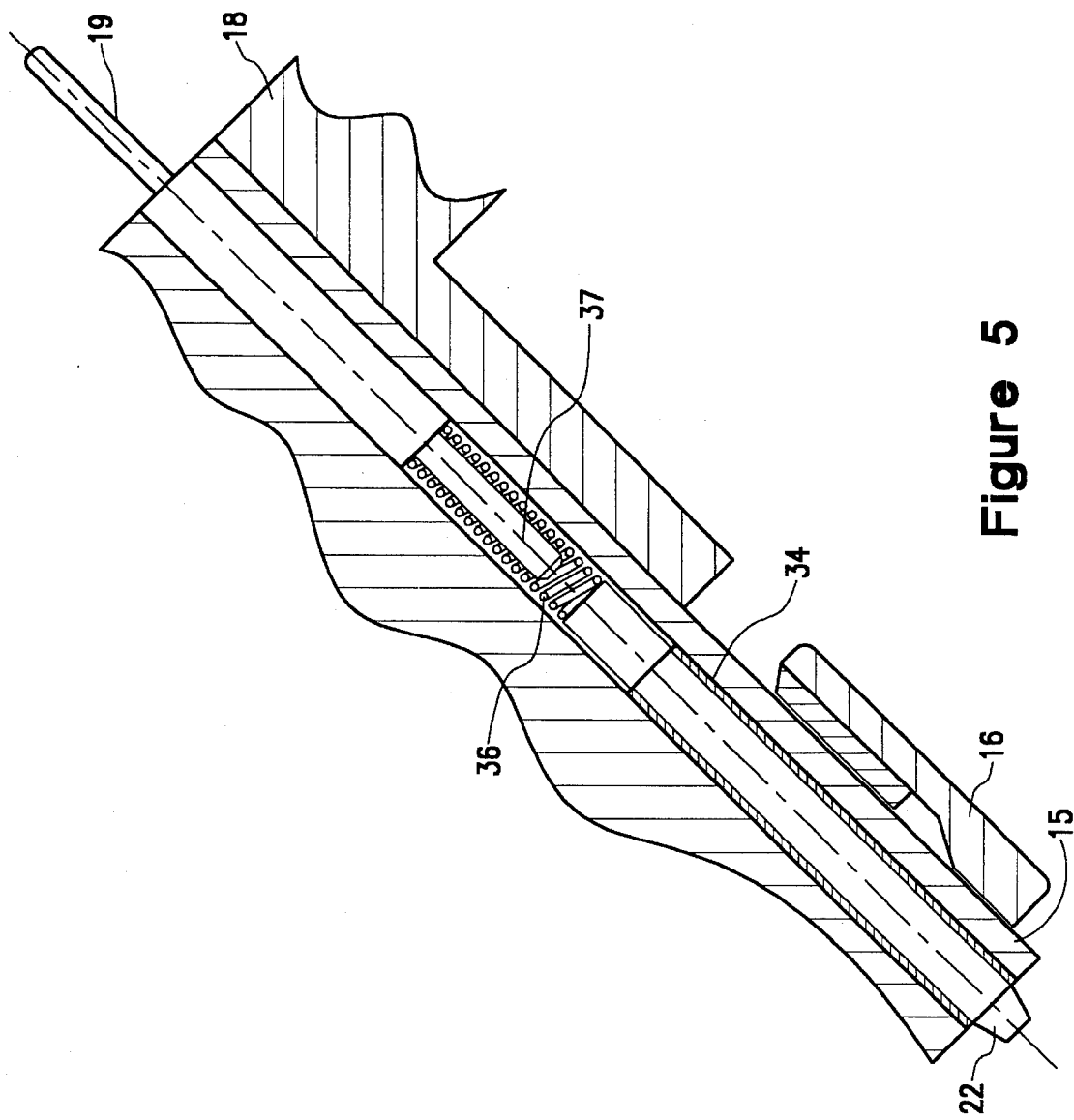
FIG. 5 is a cross-sectional view of a detail of the test assembly illustrated in FIG. 1.

FIG. 5 illustrates a detail of the assembly 10. FIG. 5 shows the spring-loaded contact 22 illustrated in FIGS. 1 and 2 which bears against the lower surface of the relay 12 in the position in which the relay is pressed against the upper surface of the body portion 15 of the assembly 10. As may be seen in FIG. 5, the contact 22 rides within a metal cylinder 34 which in a preferred embodiment is a stainless steel cylinder glued into a cylindrical channel 17 through the body portion 15 of the assembly 10. A spring 36 is fit within the channel and forces the contact 22 outwardly toward the upper surface of the portion 15. Positioning the spring 36 is a cylindrical conductor 37 which joins one of the conductors 19 projecting from the bottom of the portion 18.

In the preferred embodiment of the invention, the portion 15, the sleeve 16, and portion 18, and the base 11 are all manufactured of a thermoplastic polyester material such as a material trade named Rynite FR-530 which may be injection molded rather than formed by hand to save substantial cost. This material and the other materials of which the assembly 10 is constructed are able to withstand the extremes of temperature well so that the assembles 10 have been able to be used to test thousands of relays without structural failure. Previous materials used to manufacture these parts had become quite brittle after a very short time. The parts would break after being subject to heat and cold around the openings in the socket into which the leads from the relay were inserted. This breakage made it very difficult to insert the leads 13 into the channels. Because the new material is not subject to breakage and because the low insertion force channels are much smoother than arrangements used in the prior art, the time required to accomplish the insertion operation has been reduced from approximately ten seconds per relay to approximately three seconds per relay using the present invention. Since thousands of relays are mounted in test assemblies each day, the savings in labor costs are very great using the assemblies of the present invention.

Although the present invention has been described in terms of a preferred embodiment, it will be appreciated that various modifications and alterations might be made by those skilled in the art without departing from the spirit and scope of the invention. For example, the testing arrangement of the present invention can be used to apply similar tests to semiconductor devices housed in enclosures similar to those used for electro-mechanical relays. The invention should therefore be measured in terms of the claims which follow.

What is claimed is:

1. A test assembly for encapsulated electrical devices comprising:

a generally-cylindrical body portion,
the body portion being manufactured of a material generally impervious to extreme variations in temperature,
the body portion containing a plurality of channels extending in a direction paralleling a cylindrical axis of the body portion through the body portion from one end of the body portion toward the other end, each of the channels being larger at the one end of the body and narrowing toward the other end, conductive contacts extending outward from the other end of the body portion, a spring contact in each of the channels providing a conductive path to one of the conductive contacts, and means for urging the spring contact in each of the channels into conductive contact with a lead from any encapsulated electrical device placed in a channel, in which the means for urging the spring contact in each of the channels into conductive contact with a lead from any encapsulated electrical device placed in a channel comprises a sleeve positioned around the body portion in sliding relationship therewith, the sleeve having an inner surface adapted to contact a portion of each spring contact and urge each spring contact inwardly in one position and to allow each spring contact to relax in another position.

2. A test assembly for encapsulated electrical devices as claimed in claim 1 in which the sleeve having an inner surface adapted to contact a portion of each spring contact and urge each spring contact inwardly in one position and to allow each spring contact to press against a lead from any encapsulated electrical device placed in a channel in another position includes a portion having a generally conical shape.

3. A test assembly for encapsulated electrical devices as claimed in claim 2 in which the sleeve having an inner surface adapted to contact a portion of each spring contact and urge each spring contact inwardly in one position and to allow each spring contact to relax in another position includes a portion depending inwardly from the generally conical shape.

4. A test assembly for encapsulated electrical devices as claimed in claim 3 in which the body portion and the means for urging the spring contact in each of the channels into conductive contact with a lead placed in a channel are manufactured of a thermoplastic polyester material.

5. A test assembly for encapsulated electrical devices comprising:

a generally-cylindrical body portion manufactured of a material generally impervious to extreme variations in temperature,
the body portion containing a plurality of channels extending in a direction generally parallel to a cylindrical axis of the body portion through the body portion from one end of the body portion toward the other end,
each of the channels being generally conical in shape beginning at a wide opening at the one end of the body and narrowing toward the other end, each of the channels having an opening to the outer cylindrical surface of the body portion along a line;

a spring contact held in each of the channels providing a conductive path to the other end of the body portion;
the spring contact having a portion extending into the opening to the outer cylindrical surface of the body portion; and means for urging the spring contact in each of the channels into conductive contact with a lead from any encapsulated electrical device placed in a channel, in which the means for urging the spring contact in each of the channels into conductive contact with a lead from any encapsulated electrical device placed in a channel comprises a sleeve positioned around the body portion in sliding relationship therewith, the sleeve having an inner surface adapted to contact a portion of each spring contact within the opening to the outer cylindrical surface of the body portion and urge each spring contact inwardly in one position and to allow each spring contact to relax outwardly in another position.

6. A test assembly for encapsulated electrical devices as claimed in claim 5 in which the sleeve having an inner surface adapted to contact a portion of each spring, contact and urge each spring contact inwardly in one position and to allow each spring contact to relax outwardly in another position includes a portion having a generally conical shape.

7. A test assembly for encapsulated electrical devices as claimed in claim 6 in which the sleeve having an inner surface adapted to contact a portion of each spring contact and urge each spring contact inwardly in one position and to allow each spring, contact to relax in another position includes a portion depending inwardly from the generally conical shape.

8. A test assembly for encapsulated electrical devices as claimed in claim 7 in which the body portion and the means for urging the spring contact in each of the channels into conductive contact with a lead placed in a channel are manufactured of a thermoplastic polyester material.

9. A test assembly for encapsulated electrical devices as claimed in claim 5 in which each of the channels has a shape adapted to straighten any lead inserted in the channel.

* * * * *

UNITED STATES PATENT AND TRADEMARK OFFICE
CERTIFICATE OF CORRECTION

PATENT NO. : 5,453,695
DATED : September 26, 1995
INVENTOR(S) : Sparling et al.

It is certified that error appears in the above-identified patent and that said Letters Patent is hereby corrected as shown below:

In column 6 in claim 7 at line 51 delete "each spring, contact"
insert --each spring contact--

Signed and Sealed this

Sixteenth Day of April, 1996

Attest:

BRUCE LEHMAN

Attesting Officer

Commissioner of Patents and Trademarks